United States Patent [19]

Miyoshi et al.

[11] Patent Number: 5,548,183

[45] Date of Patent: Aug. 20, 1996

[54] MAGNETIC FIELD IMMERSION TYPE ELECTRON GUN

[75] Inventors: Motosuke Miyoshi, Tokyo, Japan; Katsuya Okumura, Poughkeepsie, N.Y.; Yuichiro Yamazaki, Tokyo, Japan

[73] Assignee: Kabushiki Kaisha Toshiba, Kawasaki, Japan

[21] Appl. No.: 364,747

[22] Filed: Dec. 27, 1994

[30] Foreign Application Priority Data

Dec. 27, 1993 [JP] Japan ..................................... 5-331638

[51] Int. Cl.⁶ .......................................................... H01J 3/20
[52] U.S. Cl. ............................. 313/153; 313/7; 313/442; 313/443; 313/310; 315/85
[58] Field of Search .............................. 313/7, 442, 443, 313/336, 153, 310; 315/85

[56] References Cited

U.S. PATENT DOCUMENTS

| | | |
|---|---|---|
| 4,397,611 | 8/1983 | Wiesner et al. . |
| 4,890,029 | 12/1989 | Miyoshi et al. . |
| 4,945,247 | 7/1990 | Kawasaki et al. ....................... 313/443 |
| 5,021,702 | 6/1991 | Miyoshi et al. . |
| 5,109,179 | 4/1992 | Faillon et al. ........................... 313/153 |

OTHER PUBLICATIONS

Yamazaki et al; "Development of the field emission electron gun integrated in the sputter ion pump"; 82576 Journal of Vacuum Science & Technology B 9 (1991) Nov./Dec., No. 6.

Troyon; "High current efficiency field emission gun system incorporating a preaccelerator magnetic lens"; Optik 57, No. 3 (1980), pp. 401–410.

*Primary Examiner*—Nimeshkumar D. Patel
*Attorney, Agent, or Firm*—Oblon, Spivak, McClelland, Maier & Neustadt, P.C.

[57] ABSTRACT

In a magnetic field immersion type electron gun for controlling an electron beam emitted by an electron gun (51) with the use of an electric lens (56) and a magnetic field lens formed by permanent magnets (57, 58) of a coaxial ion pump (53), the ion pump magnets are a pair of cylindrical permanent magnets (57, 58) disposed coaxially with an optical axis (52) of the electron gun (51) in such a way as to sandwich a cylindrical ion pump anode (61) of the coaxial ion pump; the two permanent magnets are magnetized in a mutually opposing direction; a hollow cylindrical yoke (60) is disposed also coaxially with the optical axis (52) in such a way as to enclose the two permanent magnets (57, 58) within a hollow portion thereof; and the yoke (60) is formed with an annular yoke gap (63) in a radially inner circumferential surface of the yoke (60) to leak out a magnetic flux flowing through the yoke toward the optical axis. In the above-mentioned construction, the magnetic field lens can be formed efficiently with the use of the magnetic field generated by the permanent magnets for constituting the coaxial ion pump, and further the formed magnetic field lens can be superimposed upon the electron gun. Therefore, an electric field immersion type electron gun of high performance can be obtained, and further the electron gun chamber can be efficiently evacuated in the vicinity of the cathode tip of the electron gun.

8 Claims, 9 Drawing Sheets

MAGNETIC FIELD IMMERSION TYPE ELECTRON GUN

BACKGROUND OF THE INVENTION

The present invention relates to a magnetic field immersion type electron gun for controlling electrons emitted from an electron gun by an electric field lens and further by a magnetic field lens formed by ion pump magnets of a coaxial ion pump.

In the electron gun used for an electron microscope, a large intensity is required for an electron beam emitted from the electron gun, and further the electron beam is required to be controlled by a lens of a small spherical aberration. Although the electron beam emitted from the electron gun is usually controlled by an electric field lens, it has been also known that when a magnetic field lens is superimposed upon the electric field lens, it is possible to reduce the spherical aberration effectively.

As the magnetic field lens as described above, a magnetic field formed by permanent magnets of an ion pump is usually used. The electron gun provided with the magnetic field lens as described above is referred to as a magnetic field immersion type electron gun. The ion pump of the magnetic field immersion type electron gun is a vacuum pump for evacuating a predetermined vessel of an apparatus (e.g., an electron microscope) to which an electron gun is attached.

In the ion pump, electrons are emitted from a cathode thereof against particles within the vacuum vessel for ionization, and the ionized charged particles are trapped on an anode of the ion pump as getter to evacuate the vessel. In the above-mentioned ion pump, the charged particles in the vessel are moved as by a cyclotron based upon the magnetic field of the permanent magnets, so that the frequency of collisions can be increased effectively to obtain a high vacuum. As the ion pump as described above, a coaxial ion pump disposed coaxially with the optical axis of the electron gun is widely used.

In the case where the coaxial ion pump is used, a magnetic field lens is formed by the utilization of the magnetic field generated by the permanent magnets of the coaxial ion pump, and the formed magnetic field lens is superimposed upon the cathode of the electron gun or the electric field lens to construct the magnetic field immersion type electron gun. In this case, it is possible to improve the aberration of the electron gun of field emission type, in particular.

Accordingly, the prior art techniques related to the present invention are both the magnetic field immersion type electron gun and the coaxial ion pump.

In the field emission type electron gun, an electron beam emitted at a large solid angle from an apex of emitter cathode must be converged by an emitter cathode. The electron beam is converged conventionally by use of an electric field lens. However, there exists such a drawback that the diameter of the beam increases due to the spherical aberration of the electric field lens and thereby the average intensity of the electron beam tends to be lowered.

To overcome this problem, a method of obtaining a complex lens of both the magnetic field lens and the electric field lens by superimposing a magnetic field upon the electron gun lens formed by an electrostatic field lens or by replacing a part of the electron gun lens with a magnetic field lens has been so far proposed, which is referred to as a magnetic field immersion type electron gun (e.g., M. Troyon: High current efficiency field emission gun system incorporating a pre-accelerator lens. Its use in CTEM. Optik, 57, 401 (1980)). In this document, Troyon has improved the current density by about 6 times by replacing a first anode of a three-electrode electron gun with a magnetic field lens generated by an electromagnet. In this case, the magnetic field lens must be positioned within the electron gun chamber. However, in order to operate the electric field emission type electron gun stably, since a baking (at 200° to 300° C.) is required to evacuate the electron gun chamber less than an ultra-high vacuum of $10^{-9}$ Torr, the magnetic field lens must be proof against the baking temperature. However, it is practically difficult to form the magnetic field lens so as to be proof against this high baking temperature.

To solve this problem, a relatively practical structure of the magnetic field immersion type electron gun has been proposed, in which an electromagnet is disposed outside the electron gun chamber so that the magnetic field can be applied in the vacuum vessel from the outside thereof (J. R. A. Cleaver; Field emission electron gun systems incorporating single-pole magnetic field lenses. Optik, 52,293 (1978/79). FIG. 4 shows a prior art structure proposed by Cleaver, in which a single pole magnetic field lens 5 is mounted on an electron gun chamber. The electron gun is of three electrode structure composed of a cathode 1, a extraction electrode (Wehnelt) 2, and an electron gun anode 3. A single pole magnetic field lens 8 is mounted on the upper wall of the vacuum vessel of the electron gun as a magnetic field lens. As another method of applying a magnetic field effectively from the outside of the electron gun chamber, A. Takaoka et al. have proposed a structure in which a magnetic field is superimposed from the side of the electron gun chamber (A. Takaoka et al.: Improvement of beam characteristics by superimposing a magnetic field on a field emission gun. J. Electron Microsc. 38, No. 2,83 (1989)).

The above-mentioned proposed method are of the type in which the magnetic field lens is formed by an electromagnet. In this method, however, since the vacuum system and the lens system are both provided as different systems from each other, the structure is not only complicated, but also the requirements are contradictory to each other as explained in further detail below, thus causing one of problems when the magnetic field immersion type electron gun cannot be put to practical use.

For instance, to realize high performance electron optical characteristics (mainly with respect to the aberration characteristics), it is preferable that the magnetic field intensity of the magnetic field lens superimposed upon the electric field lens is high, that is, the lens intensity is large. The best way of increasing the magnetic field intensity of the magnetic field lens is to place the electromagnet for forming the magnetic field lens near the electron gun. In this case, however, it is necessary to place the electromagnet for forming the magnetic field lens within the high vacuum of the electron gun chamber.

However, this method causes a reduction of the degree of vacuum due to gas emitted from the electromagnet. Or else, heat resistances of the various elements for constituting the electromagnet must be taken into account during the baking for evacuation, which are not preferable.

When a high intensity magnetic field is required to be applied from the magnetic field lens disposed outside the vacuum chamber, it is necessary to increase the exciting current and the number of windings (i.e., ampere-turns) of the electromagnet for forming the magnetic field lens, with the result that the size of the magnetic field lens is inevitably increased extremely.

The degree of vacuum required to operate the field emission type electron gun stably is $10^{-9}$ Torr in the case of the thermal electric field emission type and $10^{-10}$ to $10^{-11}$ Torr in the case of the cold cathode electric field emission type. To obtain the ultra-high vacuum as described above in a small sized structure, the use of a coaxial ion pump has been proposed (M. Miyoshi and Okumura U.S. Pat. No. 4,890,029. Electron beam apparatus including a plurality of ion pump blocks, Dec. 26, 1989, and M. Miyoshi and Okumura U.S. Pat. No. 5,021,702. Electron beam apparatus including a plurality of ion pump blocks, Jun. 4, 1991). In the coaxial ion pump as disclosed in these Patents, some permanent magnets for constructing the ion pump are arranged coaxially with the optical axis of the electron gun and the electric field lens in symmetry about the same optical axis, and further the evacuating portions of the electron gun and the ion pump are formed integral with each other.

FIGS. 5 and 6 are cross-sectional views showing the prior art coaxial ion pump. FIG. 5 shows a first example of the prior art coaxial ion pump. In a cylindrical outer casing 10 for constructing a vacuum vessel of the coaxial ion pump, an electron gun 11 is disposed at the central axis thereof, and further an evacuation operation portion (i.e., ion pump portion) 12 is disposed coaxially with the optical axis of the electron gun 11 so as to enclose the electron gun 11.

The electron gun 11 is provided with an electron gun body 13, a cathode 14 mounted on the lower tip portion of the electron gun body 13, and a hollow cylindrical anode 15 formed with a hole through which an electron beam B emitted from an apex portion (the lower end cathode 14) of the electron gun body 13 is passed. The electron gun lens portion, that is, the electric field lens is composed of the cathode 14 and the anode 15. The electron beam B emitted from the cathode 14 at a wide angle is converged by the electric field lens and then introduced into another apparatus arranged below.

The ion pump portion 12 is provided with a cylindrical inside permanent magnet 16 disposed coaxially with the central axis, an outside permanent magnet 17 also disposed coaxially with the central axis, and an ion getter portion 18 interposed between the inside permanent magnet 16 and the outside permanent magnet 17 also coaxially therewith. The inside permanent magnet 16 and the outside permanent magnet 17 generate a magnetic field in a radial direction of the outer casing 10, and the intensity of the magnetic field is about 1500 to 2000 gauss.

The ion getter portion 18 is composed of a cylindrical ion pump anode 19 disposed coaxially with the optical axis of the electron gun 11, and a plurality of cylindrical ion pump cathodes (gettering electrodes) 20 and 26 formed of titanium so disposed as to sandwich the ion pump anode 19 between both inside and outside thereof.

In the coaxial ion pump, since the electron beam b is self-shielded by the inside permanent magnet 16, it is possible to reduce the influence of the permanent magnets 16 and 17 upon the electron beam b. However, the fact that the electron beam b is self-shielded from the magnetic field of the inside permanent magnet 16 is not appropriate from the structural point of view when considering the object that the magnetic field must be positively superimposed upon the electron beam b emitted from the magnetic field immersion type electron gun 11.

FIG. 6 shows a second prior art example of the prior art coaxial ion pump. In this structure, a plurality of coaxial ion pump anodes 31 are arranged around an electron gun 13, and a pair of annular ion pump cathodes (gettering cathodes) 32 are disposed so as to sandwich the ion pump anode 13 between both upper and lower sides of the ion pump anode 31. Further, outside a vacuum vessel 30, two cylindrical permanent magnets 33 and 34 are disposed on both the upper and lower sides of the ion pump cathodes 32, respectively, so that a magnetic field can be applied in parallel to the arrangement direction of the ion anode 31.

In the coaxial ion pump of this structure, it is possible to construct the magnet field immersion type electron gun by superimposing the magnetic field generated by the permanent magnets 33 and 34 upon the electric field lens of the electron gun from the structural point of view. The theoretical analysis results of a prototype electron gun of this type are explained in a paper (Y. Yemazaki, M. Miyoshi, T. Nagai and Okumura: Development of the field emission electron gun integrated in the sputter ion pump, J. Vac. Sci, Techno., B9(6), November/December 2967 (1991).

Further, FIGS. 7 to 9 show another prior art example of the magnetic field immersion type electron gun of the structure in which the coaxial ion pump and the field emission type (FE) electron gun are integrated with each other. FIG. 7 is a cross-sectional view showing the magnetic field immersion type electron gun of the structure, in which the coaxial ion pump and the electric field emission type (FE) electron gun are integrated with each other. FIG. 8 shows the distribution of the magnetic field intensity along the central axis of the magnetic field immersion type electron gun in correspondence to the shape of the magnetic field lens thereof; and FIG. 9 shows the magnetic fields generated by the permanent magnets 43 and 44.

The magnetic field immersion type electron gun shown in FIG. 7 is basically the same in structure as with the case shown in FIG. 6. In FIG. 7, two cylindrical permanent magnets 43 and 44 are disposed outside a vacuum vessel 40 under atmospheric pressure. To prevent the magnetic field from being leaked toward the outside and further, to form a closed magnetic circuit as perfect as possible, a malleable iron yoke 45 formed with a cylindrical hollow portion and formed into U-shape in cross section is provided in such a way that two permanent magnets 43 and 44 are attached to the upper inside surface and the lower inside surface of the yoke 45.

Within a vacuum vessel 40, a cylindrical ion pump anode 46 is disposed between the two permanent magnets 43 and 44. These permanent magnets 43 and 44, the ion pump anode 46, and the yoke 45 are all arranged coaxially with the central axis 49 of the electron gun body 47 and the electron gun lens 48. At the end of the electron gun 47, cathode 42 of the electron gun is attached to the electron gun 47.

In this structure, it is possible to obtain the magnetic field distribution as shown in FIG. 8 along the central axis thereof. However, there exists a problem in that the magnetic field intensity direction is reversed at points A; C and B, respectively.

The reason thereof will be explained with reference to FIG. 9. Here, the assumption is made that the two permanent magnets 43 and 44 are mounted upper and lower sides in such a way that the magnetic poles are arranged as S→N→S→N. Then, the magnetic field As directed from the permanent magnet 43 to the permanent magnet 44 near the ion pump anode 46, and further leaks (deviates) largely toward the central axis 49, as shown in FIG. 9. This leaked magnetic field forms the magnetic field at the middle peak point B (the maximum intensity at the middle height position along the central axis 49) in the magnetic field distribution shown in FIG. 8. On the other hand, in the vicinity of the edge portions 43a and 44a of the respective permanent magnets 44 and 43, leaked magnetic fields flow toward the yoke 45, respectively. The direction (upward) of this magnetic field is opposite to that (downward) of the magnetic field at the middle portion. Accordingly, there exists the opposite magnetic field intensity distribution having sub-peak points A and C both above and below the main peak B, as shown in FIG. 8.

In the structure as shown in FIG. 6 or 7 although the magnetic field distribution near the central axis as described above can be modified to some extent by design, it is impossible to basically eliminate the distribution as shown in FIG. 8.

In this case, the magnetic field at the middle main peak B or the lower sub-peak A is to be used as the magnetic field lens of the magnetic field immersion type electron gun. Here, it is preferable to use the main middle peak B when only the lens effect of the magnetic field lens is taken into account, because the magnetic field intensity is large. However, since this main peak B is located as the fairly inner side of the coaxial ion pump (at a central height position of the ion pump anode 46 on principle), it is rather difficult to layout the mechanical elements. Further, since the sub-peak A under the main peak B is superimposed upon the central (optical) axis 49 of the electron beam, two magnetic field lenses are eventually superimposed, so that there exists such a problem in that the analysis is complicated and thereby the design is difficult. Accordingly, in practice, the magnetic field immersion type lens is constructed by superimposing the lower sub-peak A upon the electron gun lens.

Further, in this method, since the magnetic energy of the two permanent magnets 43 and 44 is separated into three peaks A, B and C, so that the utilization efficiency of the magnetic energy is not high. This implies that in order to form a stronger magnetic field lens, a permanent magnet of unnecessarily high surface magnetic flux density (high cost) must be used or else the thickness of the permanent magnet cylinder must be increased to increase the surface magnetic flux density, thus causing another problem in that the weight and the size of the apparatus are inevitably increased.

Further, another prior art method of constructing an ion pump coaxially with the optical axis of the electron gun and further utilizing the magnetic field generated by a permanent magnet of the ion pump as the magnetic field lens is proposed by Wiesner (J. C. Wiesner et al. U.S. Pat. No. 4,397,611. Particle beam instrumentation ion pump, Aug. 9, 1983).

In this method, a pair of ring-shaped permanent magnets are arranged on both upper and lower sides coaxially with the electron gun in such a way as to be supported by a yoke disposed inside the permanent magnets (on the ion pump anode side sandwiched between a pair of the permanent magnets). A magnetic field is applied to a vacuum vessel through the yoke, and the ion pump anode is disposed within the vacuum vessel for vacuum evacuation. In this case, the magnetic field generated by a pair of upper and lower ring-shaped permanent magnets forms the magnetic field lens. The structure is similar to that shown in FIG. 7.

However, this prior art structure involves the following problems:

(1) Since the magnetic field is applied from the permanent magnets through the yoke to the ion pump anode portion at which the strongest magnetic field intensity is required (at which the actual evacuation is effected, and further the evacuation speed is proportional to the square of the magnetic field intensity), the effective magnetic field intensity is attenuated markedly or the magnetic force lines form a magnetic circuit in the yoke, with the result that the evacuation speed is lowered.

(2) Since the ring-shaped permanent magnets and the yoke are combined with each other, in the same-reason as explained with reference to FIGS. 8 and 9, a plurality of magnetic field peaks are inevitably formed around the central axis.

As explained above, the prior art technique related to the magnetic field immersion type electron gun involves the following problems:

(1) In the case of the method of forming the magnetic field lens in the magnetic field immersion type electron gun by the electromagnet of the coaxial ion pump, since a large magnetic field intensity is preferably required to improve the magnetic field lens, in order to increase the magnetic field intensity of the superimposed magnetic field lens, it is necessary to place the electromagnet of the coaxial ion pump near the electron gun or else to use a large electromagnet for generating a fairly strong magnetic field.

In this case, in order to place the electromagnet near the electron gun, the electromagnet must be disposed within the vacuum vessel. As a result, in order to operate the electric field emission type electron gun stably within an ultra-high vacuum, there arise various problems such as gas discharge, heat resistance during baking, etc.

Further, although a large electromagnet can be used when disposed outside the vacuum vessel, since the exciting current and the ampere-turns are both increase, the size of the magnetic field lens inevitably increases.

(2) The method of controllably superimposing the magnetic field of the permanent magnet in the coaxial ion pump upon the electric field lens of the electron gun, that is, the method of forming the magnetic field immersion type electron gun is the best method in practical use. In the prior art method so far proposed, however, since the unitization efficiency of the magnetic field of the permanent magnet is relatively low and further a plurality of magnetic field intensity peaks are generated, it is difficult to design the magnetic field lens. In addition, since the peak position of the maximum magnetic field intensity of the best performance is generated deep inside the ion pump, an electron gun lens of complicated structure must be arranged within a narrow space, so that the mechanical layout is markedly limited.

SUMMARY OF THE INVENTION

Accordingly, it is the object of the present invention to provide a magnetic field immersion type electron gun, which proposes an optimum construction with respect to the shape of yoke and the arrangement of permanent magnets in a coaxial ion pump. In the proposed optimum construction, a magnetic field immersion type electron gun of high performance can be realized by forming the magnetic field lens efficiently with the use of the magnetic field generated by the permanent magnets for constituting the coaxial ion pump and further by superimposing the formed magnetic field lens upon the electron gun. Further, the magnetic field immersion type electron gun according to the present invention can satisfy the basic object such that the electron gun chamber, in particular in the vicinity of the cathode tip of the electron gun (at which an ultra-high vacuum is required) is evacuated efficiently.

To achieve the above-mentioned object, the present invention provides a magnetic field immersion type electron gun for controlling an electron beam by an electric field lens and a magnetic field lens in combination, comprising: an electron gun body for emitting the electron beam; an electric field lens system disposed under said electron gun body, for forming the electric field lens to control the electron beam emitted by said electron gun body; and a coaxial ion pump including: a cylindrical anode and at least one cathode; a pair of cylindrical permanent magnets disposed coaxially with an optical axis of said electron gun body in such a way as to sandwich said cylindrical anode and cathode therebetween and magnetized in a mutually opposing direction of said two permanent-magnets; and a hollow cylindrical yoke disposed also coaxially with the optical axis thereof in such a way as to enclose said two permanent magnets within a hollow portion thereof, said hollow cylindrical yoke being formed with an annular yoke gap in a radially inner circumferential surface thereof to leak out a magnetic flux flowing through said hollow cylindrical yoke toward the optical axis thereof so that a magnetic field lens can be formed and further superimposed upon the electric field lens formed by said electric field lens system.

In the above-mentioned magnetic field immersion type electron gun, a height position of the yoke gap along the optical axis roughly matches a vertical position of an electron gun cathode attached to a tip portion of said electron gun body.

Further, a pair of said permanent magnets are disposed in such a way as to sandwich the ion pump anode and cathode in a direction perpendicular to the optical axis.

Further, a pair of said permanent magnets are disposed in such a way as to sandwich the ion pump anode and cathode in a direction parallel to the optical axis.

Further, the yoke gap is formed at a lower end portion of the radially inner circumferential surface of said hollow cylindrical yoke so as to face an electron gun cathode.

Further, a pair of said permanent magnets are disposed within a vacuum vessel of said coaxial ion pump.

Further, said permanent magnets are formed of samarium cobalt.

In the magnetic field immersion type electron gun according to the present invention, a pair of cylindrical permanent magnets are disposed coaxially with the optical axis of the electron gun body in such a way as to sandwich the cylindrical anode and cathodes of the coaxial ion pump, and further the two permanent magnets are magnetized in the mutually opposing direction of the two permanent magnets. Further, the hollow cylindrical yoke is disposed also coaxially with the optical axis in such a way as to enclose the two permanent magnets within the hollow portion thereof. Therefore, the direction of the magnetic flux formed by the two permanent magnets is parallel to the optical axis in the radially inner circumferential surface (on the innermost side facing the optical axis) of the yoke. Further, since the yoke is formed with an annular yoke gap in the radially inner circumferential surface of the yoke so as to leak out a magnetic flux flowing through the yoke toward the optical axis, a magnetic field can be formed in symmetry with respect to the optical axis. Further, this magnetic field has a single peak value in its intensity distribution.

Accordingly, since the single magnetic field lens can be effectively superimposed upon the electron gun lens, it is possible to realize the magnetic field immersion type electron gun of high performance and simultaneously the coaxial ion pump of small size and of high evacuation capability.

DETAILED DESCRIPTION OF THE EMBODIMENTS

A first embodiment of the magnetic field immersion type electron gun according to the present invention will be described hereinbelow with reference to FIGS. 1 and 2.

Figure 1:
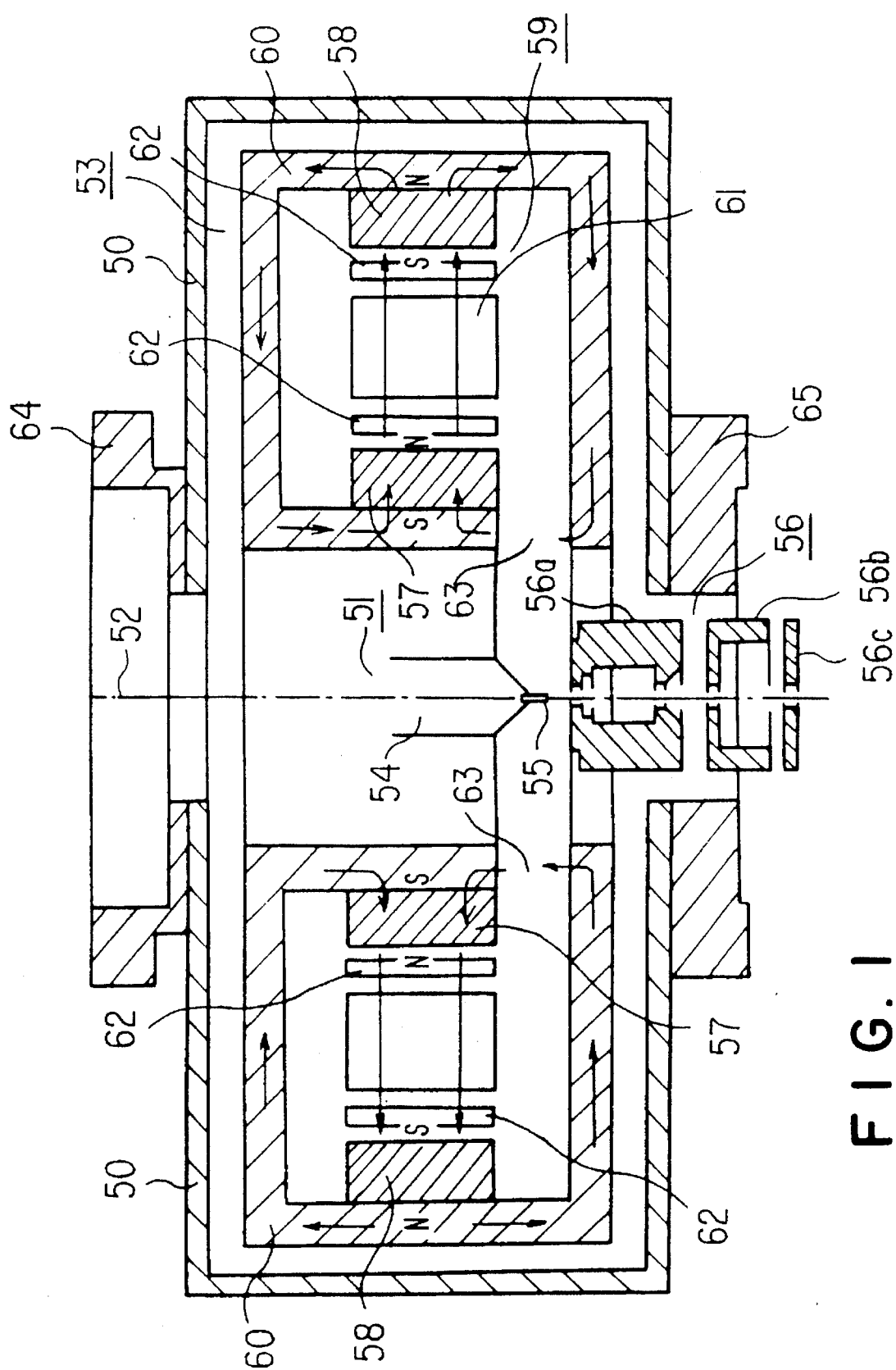
FIG. 1 is a cross-sectional view showing a first embodiment of the magnetic field immersion type electron gun according to the present invention.

In FIG. 1, in a cylindrical outer casing 50 for constructing a vacuum vessel of the coaxial ion pump, an electron gun 51 is disposed at the central axis of the outer casing 50, and further an evacuation operation portion (i.e., ion pump portion) 53 is also arranged coaxially with the optical axis 52 of the electron gun 51 so as to enclose the electron gun 51.

The electron gun 51 is provided with an electron gun body 54, an electron gun cathode 55 mounted on the lower tip portion of the electron gun body 54, and an electron gun lens system 56 disposed under the electron gun body 54. The electron gun lens system 56 forms a hollow cylindrical electric field lens, and has a hole through which an electron beam can be passed at an upper end portion of the lens system 56. The electron gun lens system 56 is an electric field lens portion of the electron gun lens, which is composed of a extraction electrode 56a, a lens electrode 56b and an anode electrode 56c.

An ion pump (evacuation) portion 53 is provided with a cylindrical inside permanent magnet 57 disposed coaxially with the optical axis 52 of the electron gun 51, a cylindrical outside permanent magnet 58 disposed outside the inside permanent magnet 57 also coaxially with the optical axis 52, a plurality of ion getter portions 59 interposed between the inside permanent magnet 57 and the outside permanent magnet 58 in the radial direction coaxially with these permanent magnets 57 and 58, and a hollow cylindrical yoke 60 disposed coaxially with the optical axis 52 so as to enclose the two permanent magnets 57 and 58 within its hollow portion. These permanent magnets 57 and 58 are held by the yoke 60 formed of an malleable iron.

The permanent magnets 57 and 58 are of SmCo (samarium cobalt) based rare-earth element magnet. The SmCo based magnet is high in thermal stability and excellent in irreversible temperature change characteristics (the demagnetization ratio is as low as 1% or less at 150° C. for 100 hours), which is sufficiently proof against backing temperature for obtaining a high vacuum. Further, when being plated with nickel for prevention of degasification, the SmCo based magnet can be sufficiently proof within a vacuum as high as $10^{-10}$ Torr or less.

The inside permanent magnet 57 and the outside permanent magnet 58 are magnetized in the radial direction perpendicular to the optical axis 52, so that magnet flux is generated so as to pass through an ion pump anode 61 in the radial direction beginning from the optical axis 52 in a plane perpendicular to the optical axis 52.

Further, as far as a radial magnetic field can be generated, without being limited only to the cylindrical shape, any shape of a pair of the cylindrical permanent magnets 57 and 58 can be adopted (e.g., polygonal (e.g., octagonal) shape, etc.).

The ion getter portion 59 is composed of a cylindrical ion pump anode 61 disposed coaxially with the optical axis 52 of the electron gun 51, and ion pump cathodes (a plurality of cylindrical gettering electrodes) 62 formed of titanium so disposed as to sandwich the ion pump anode 61 between both inside and outside thereof.

Further, an annular yoke gap 63 is formed coaxially with the optical axis 52 under the radially inner circumferential surface of the yoke 60 (the position at which the yoke 60 faces the optical axis 52). This yoke gap 63 is so formed that the middle height position of the yoke gap 63 along the optical axis 52 roughly matches the vertical position of the cathode 55 attached to the lower tip portion of the electron gun body 54.

This yoke gap 63 serves to leak out the magnetic flux flowing through the yoke 60 toward the optical axis 52; that is, the magnetic flux is leaked from the yoke (magnetic flux leakage) so that a magnetic field lens can be formed. Further, since the electron gun portion 56 can be evacuated through the yoke gap 63, the evacuation conductance can be improved, so that the actual evacuation speed can be eventually increased.

The respective ion pump composing elements including the yoke 60, the two permanent magnets 57 and 58, the ion pump anode 61 are all disposed within the vacuum vessel 50 connected to two upper and lower outer flange portions 64 and 65. The upper flange 64 is connected to a stage (not shown) for supporting the electron gun 51, and the lower flange 65 is connected to a column, respectively. Here, although the yoke 60 is disposed within the vacuum vessel 50, it is of course possible to use the yoke 60 in common as the outer casing of the vacuum vessel 50.

The operation of the first embodiment will be described hereinbelow.

The assumption is made that the inside permanent magnet 57 is magnetized to S pole on the inner side and N pole on the outer side, and the outside permanent magnet 58 is magnetized to S pole on the inner side and N pole on the outer side. Then, as shown by arrows in FIG. 1, a magnetic flux can be formed from the inside permanent magnet 57 to the outside permanent magnet 58 in a plane perpendicular to the optical axis 52 so as to pass through the ion pump anode 61 in the radial direction thereof. The magnetic flux emitted radially from the outside permanent magnet 58 passes through both the upper side and the lower side of the yoke 60 and then returns to the inside permanent magnet 57. Since the yoke 60 is formed with a single annular yoke gap 63, a magnetic flux leaks from the yoke 60 at the yoke gap 63 (magnetic flux leakage).

Figure 2:
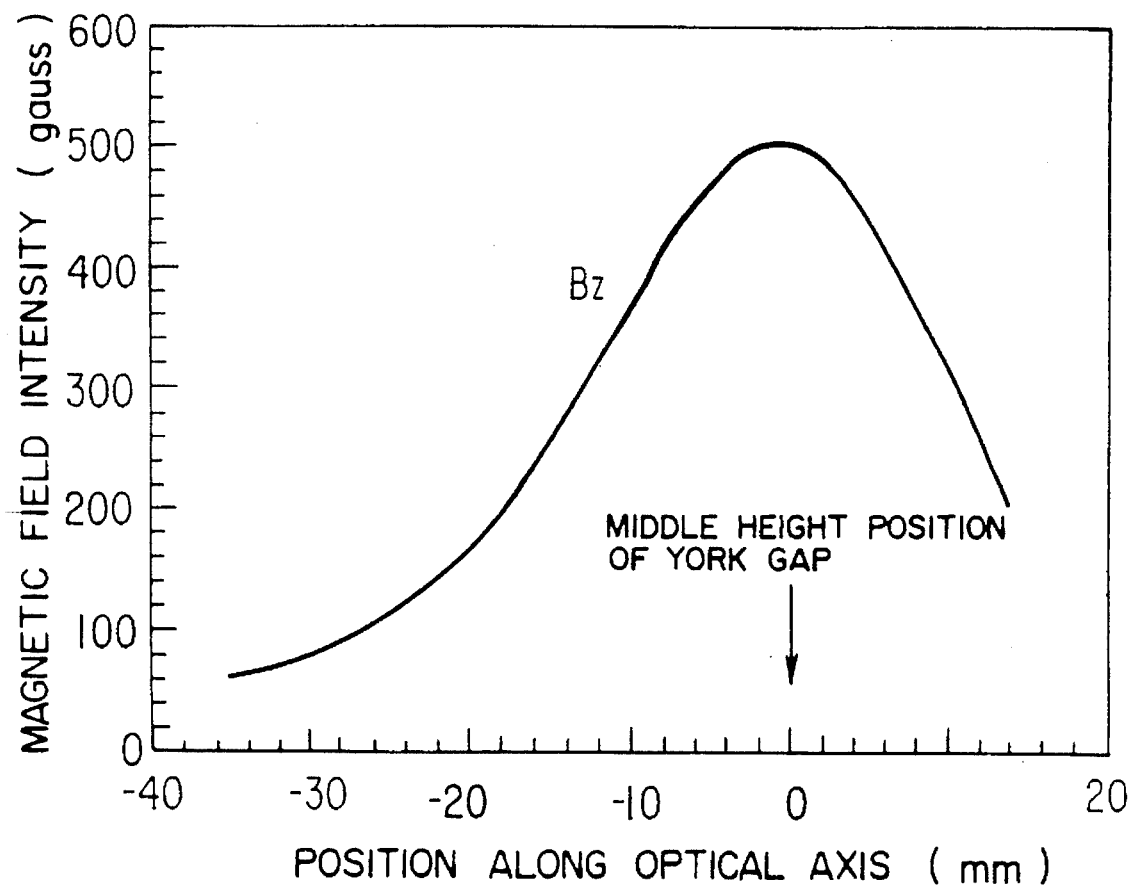
FIG. 2 is a graphical representation showing the magnetic field intensity distribution along the optical axis of the magnetic field lens formed between a yoke gap shown in FIG. 1.

FIG. 2 shows a simulation result of the magnetic field intensity distribution along the optical axis 52. In FIG. 2, the origin (zero position) is determined at the middle height position of the yoke gap 63, and the upper side position from this origin is determined to be positive and the lower side position from this origin is determined to be negative. The two permanent magnets 57 and 58 are formed of SmCo, and the surface magnetic flux density thereof is 1500 gauss, respectively. Further, the yoke 60 is formed of malleable iron. FIG. 2 indicates that a magnetic field lens can be formed in such a way that a peak value of about 500 gauss is located at the middle height position of the yoke gap 63 (at the cathode tip position in FIG. 1). In addition, this magnetic field lens has only a single peak position.

The peak magnetic field intensity of 500 gauss is equivalent to an objective lens operated at the several kilovolts in the acceleration voltage range, which indicates that a strong magnetic field lens can be formed. In addition, since the single peak magnetic field lens can be formed and since the number of the formed lens is one, as already explained under the Background of the Invention, it is possible to utilize the magnetic energy of the permanent magnets efficiently and further to facilitate the analysis of the magnetic field lens and thereby to optimize the design of the whole electron gun.

As explained above, in the construction of the present embodiment, since the yoke 60 is formed with an annular yoke gap 63 so that the magnetic flux flowing through the radially inner circumferential surface (facing to the optical axis 52) of the yoke 60 can be leaked out toward the optical axis 52, it is possible to form the magnetic field having a single peak value in symmetry with respect to the optical axis 52. As a result, the magnetic field lens can be superimposed upon the electric field lens. Further, since the magnetic field lens has a distribution of the magnetic field intensity of single peak value, the magnetic energy of the permanent magnets can be utilized effectively. Further, since only the single magnetic lens is formed, the analysis of the magnetic field lens is easy and thereby the whole electron gun can be easily designed under the optimum conditions.

Further, since the electron gun lens portion 56 can be evacuated through the yoke gap 63, the evacuation conductance can be improved and thereby the actual evacuation speed can be increased.

Further, since the middle height position of the yoke gap 63 is roughly the same as the vertical position of the cathode 55 attached to the lower tip portion of the electron gun body 54, it is possible to match the magnetic field lens formed by the magnetic field leaked from the yoke gap 63 with the position of the cathode 55. As a result, since the electron beam emitted from the cathode 55 can be immediately introduced into the magnetic field lens, it is possible to control the electron beam into a spherical wave under excellent conditions, as compared when the electron beam is controlled by the magnetic field lens after having traveled at a long distance, with the result that it is possible to reduce the spherical aberration of the magnetic field lens effectively.

Further, since being formed of samarium cobalt, even if the permanent magnets 57 and 58 are disposed within the vacuum vessel 50 of the ion pump, the permanent magnets can be proof against the high baking temperature. Further, when the permanent magnets are plated with nickel as the countermeasure against degasification, it is possible to obtain a vacuum as high as $10^{-10}$ Torr or less.

Figure 3:
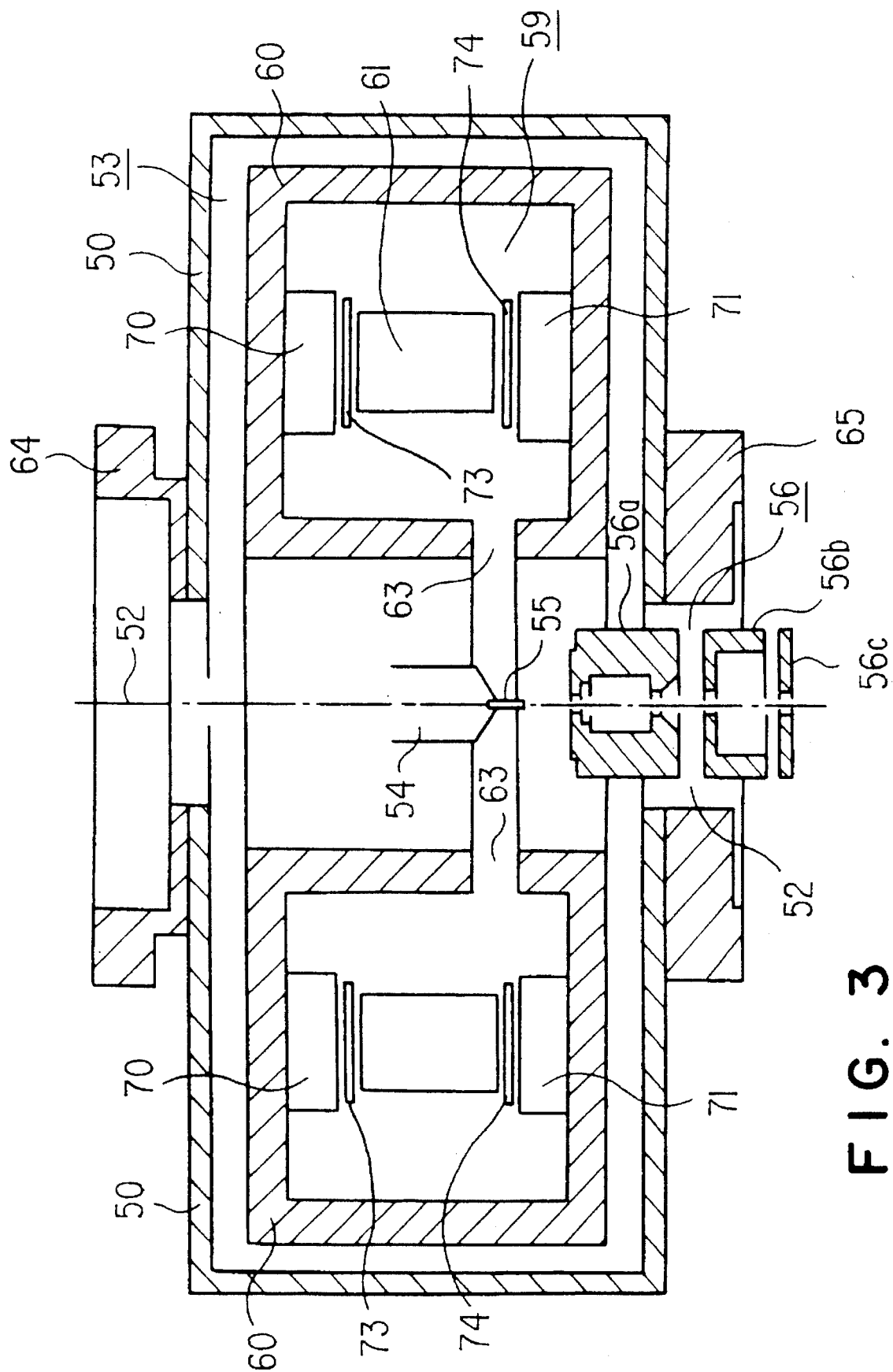
FIG. 3 is a cross-sectional view showing a second embodiment of the magnet field immersion type electron gun according to the present invention.
Figure 4:
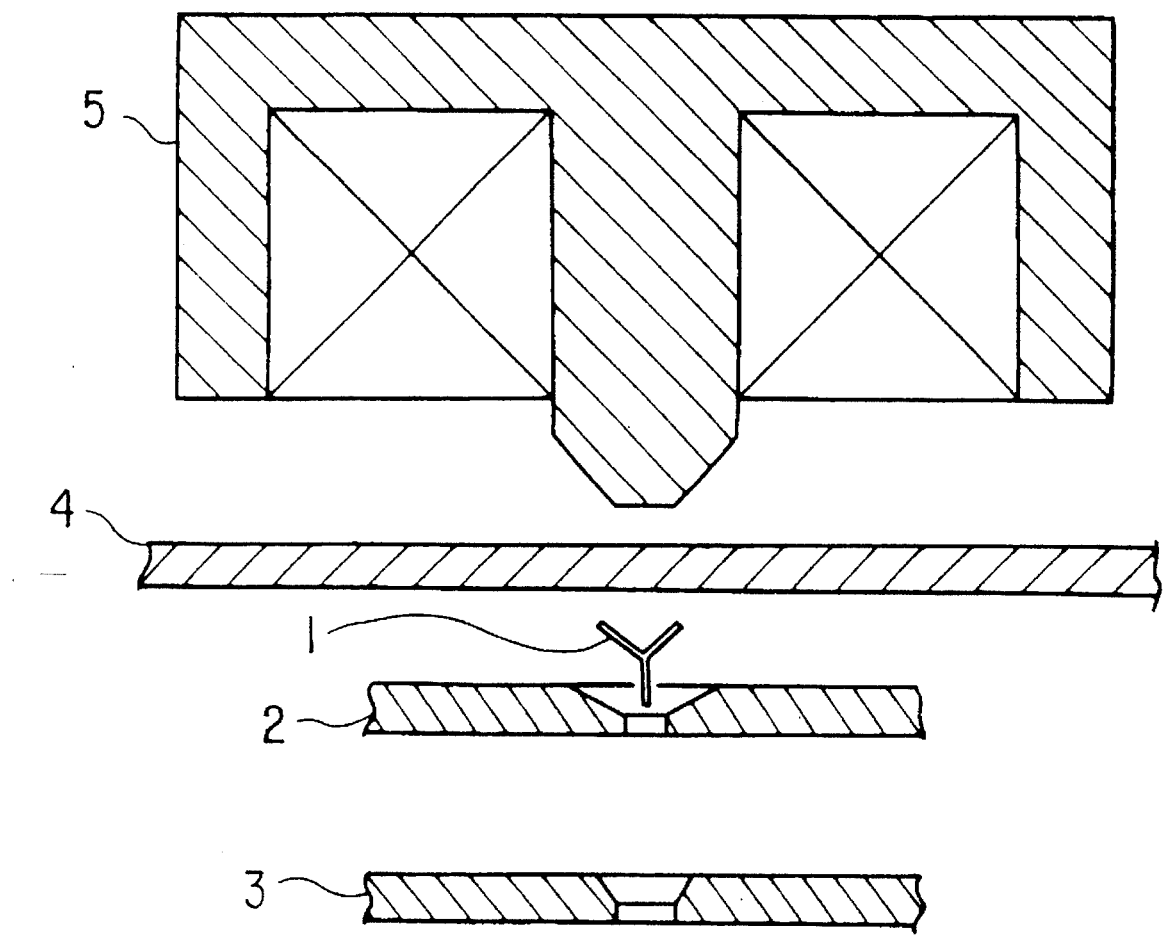
FIG. 4 is a cross sectional view showing a prior art example of the magnetic field immersion type electron gun having an electromagnet disposed outside the electron gun chamber.
Figure 5:
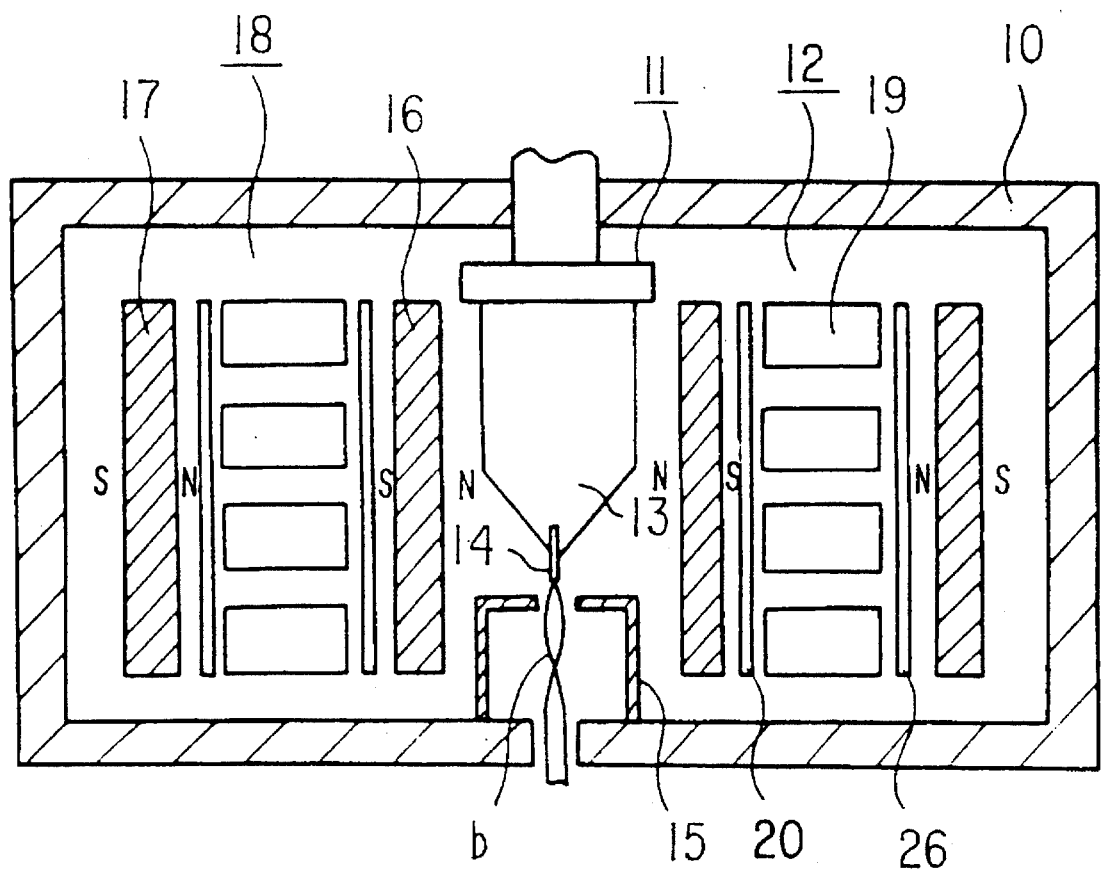
FIG. 5 is a cross sectional view showing a first prior art example of the magnetic field immersion type electron gun which uses a coaxial ion pump.
Figure 6:
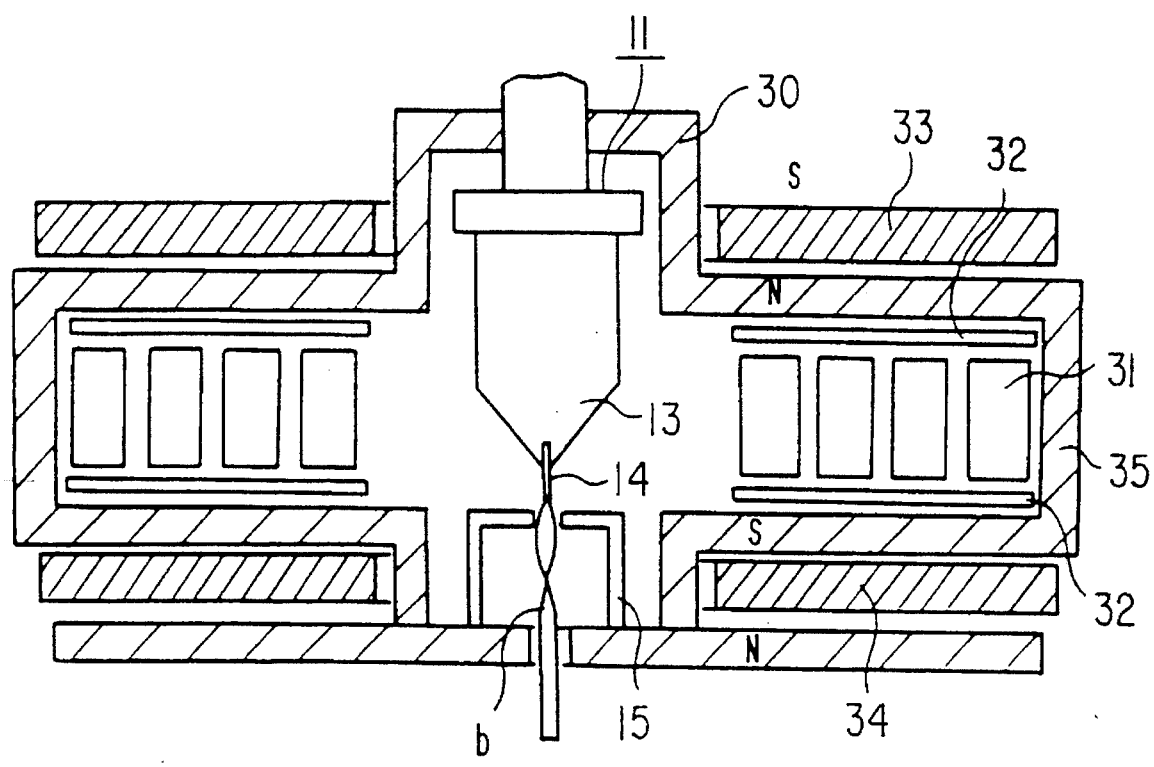
FIG. 6 is a cross sectional view showing a second prior art example of the magnetic field immersion type electron gun which uses a coaxial ion pump.
Figure 7:
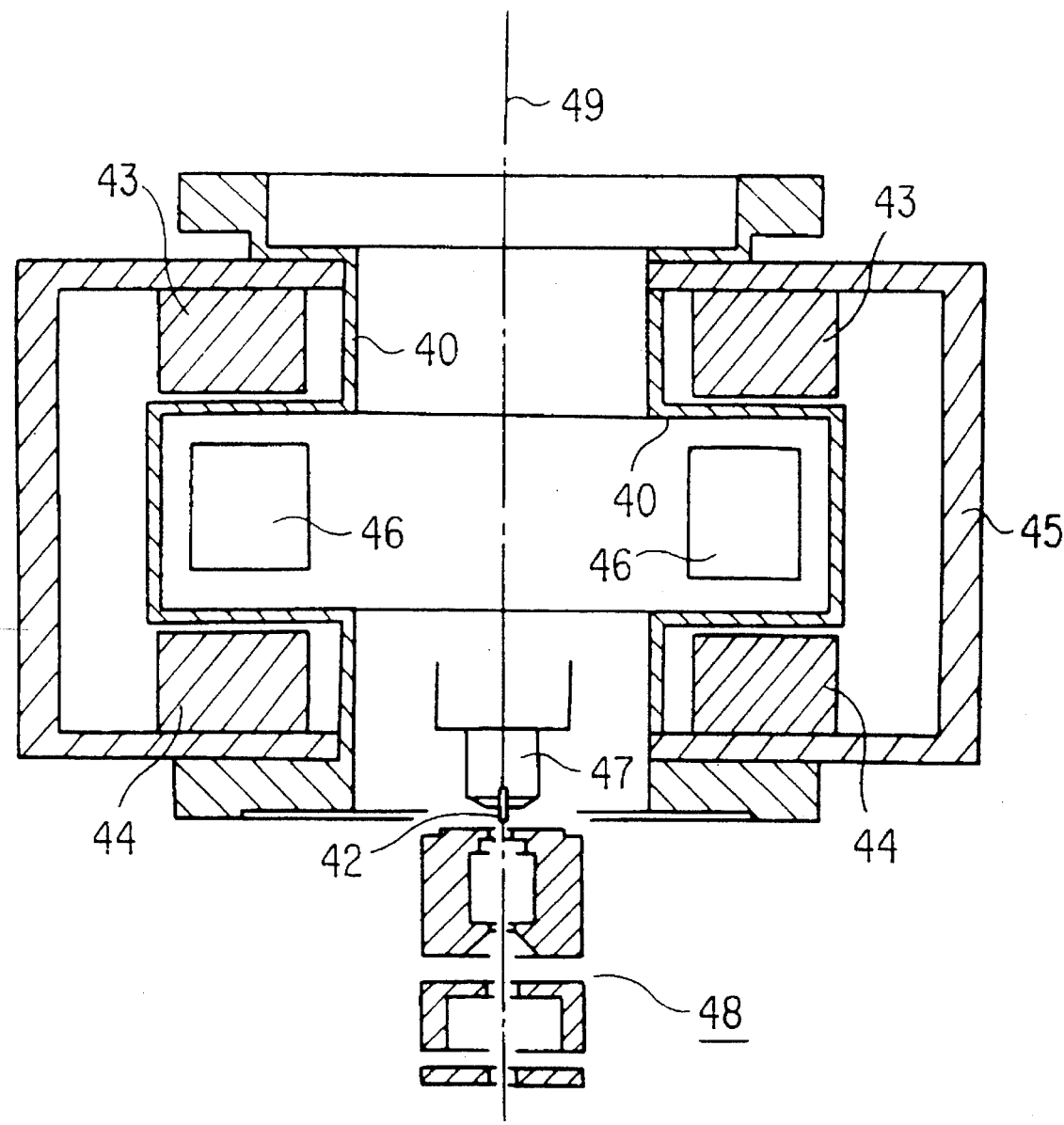
FIG. 7 is a cross sectional view showing a prior example of the magnetic field immersion type electron gun in which a coaxial ion pump and an electric field emission type electron gun are formed integral with each other.
Figure 8:
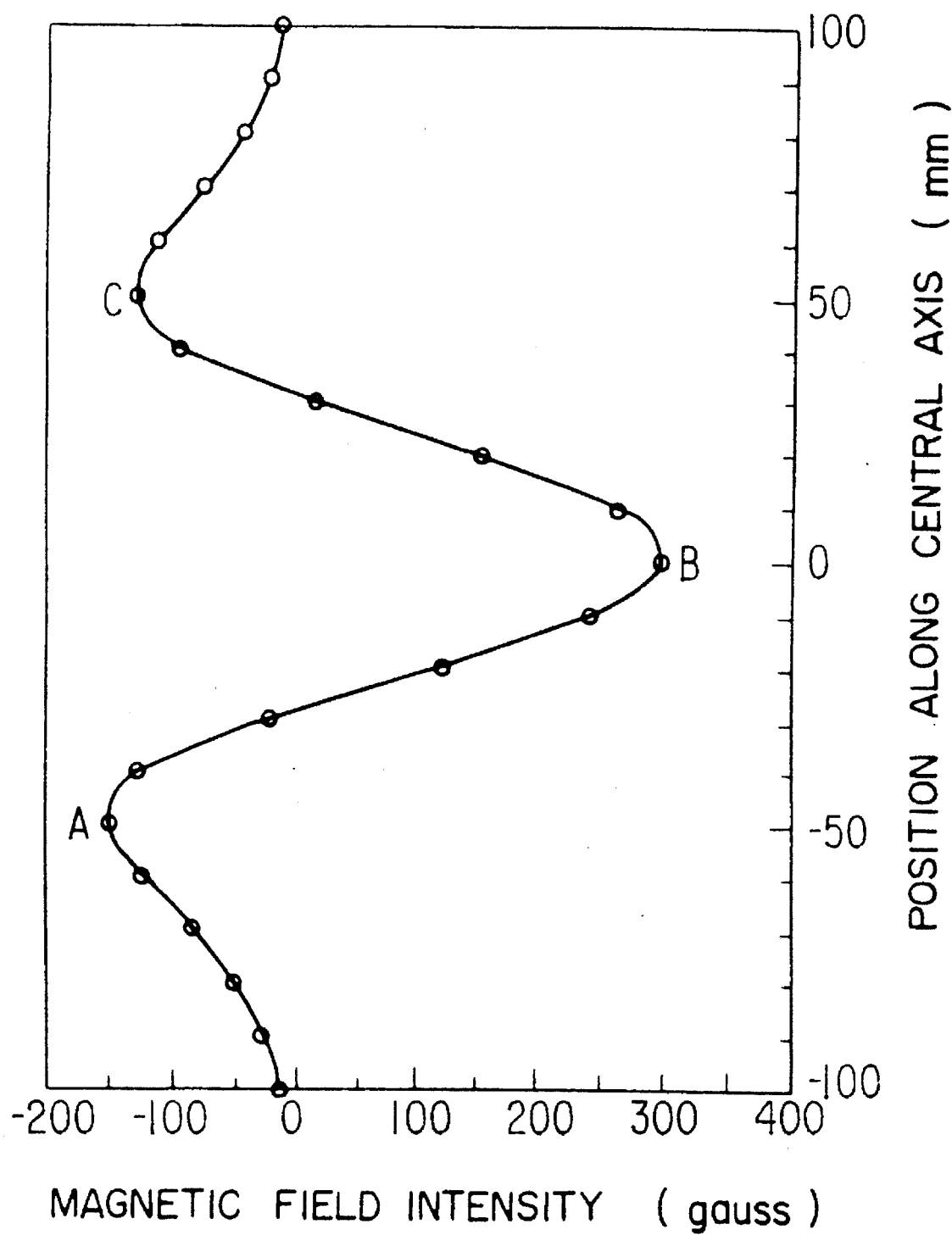
FIG. 8 is a graphical representation showing the magnetic field intensity distribution along the central axis of the magnetic field immersion type electron gun shown in FIG. 7.
Figure 9:
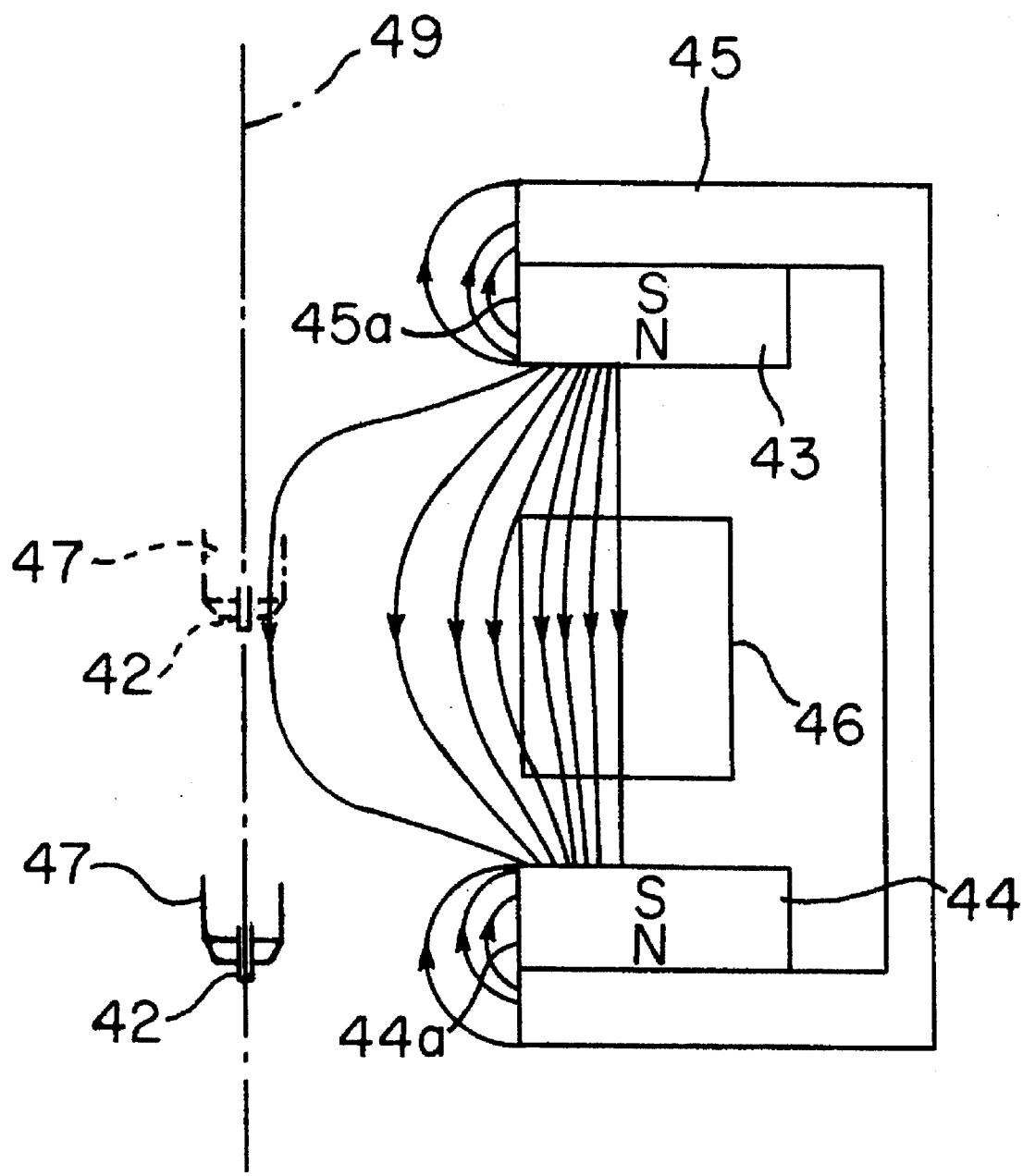
FIG. 9 is an illustration for assistance in explaining the magnetic force lines generated by the magnetic field immersion type electron gun in correspondence to FIGS. 7 and 8.

A second embodiment of the present invention will be described hereinbelow with reference to FIG. 3.

In this embodiment, two permanent magnets 70 and 71 of the ion pump are disposed coaxially with the optical axis 52 in such a way as to sandwich the ion pump anode 61 in the axial direction. Further, the two ion pump cathodes 73 and 74 are disposed coaxially with the optical axis 52 in such a way as to sandwich the ion pump anode 61 also in the axial direction. The yoke 60 is formed with a yoke gap 63. In the construction as described above, it is possible to form a magnetic field lens by the magnetic flux leaked from the yoke gap 63 at the position at which the cathode 55 of the electron gun is located, so that the same effect as with the case of the first embodiment can be also obtained.

What is claimed is:

1. A magnetic field immersion type electron gun for controlling an electron beam by an electric field lens and a magnetic field lens in combination, comprising:

an electron gun body for emitting the electron beam;

an electric field lens system disposed under said electron gun body, for forming the electric field lens to control the electron beam emitted by said electron gun body; and a coaxial ion pump including:
a cylindrical anode and at least one cathode;
a pair of cylindrical permanent magnets disposed coaxially with an optical axis of said electron gun body in such a way as to sandwich said cylindrical anode and cathode therebetween and magnetized in a mutually opposing direction; and
a hollow cylindrical yoke disposed also coaxially with the optical axis thereof in such a way as to enclose said two permanent magnets within a hollow portion thereof, said hollow cylindrical yoke being formed with an annular yoke gap in a radially inner circumferential surface thereof to leak out a magnetic flux flowing through said hollow cylindrical yoke toward the optical axis thereof so that a magnetic field lens can be formed and further superimposed upon the electric field lens formed by said electric field lens system.

2. The magnetic field immersion type electron gun of claim 1, wherein a height position of the yoke gap along the optical axis roughly matches a vertical position of an electron gun cathode attached to a tip portion of said electron gun body.

3. The magnetic field immersion type electron gun of claim 1, wherein a pair of said permanent magnets are disposed in such a way as to sandwich the ion pump anode and cathode in a direction perpendicular to the optical axis.

4. The magnetic field immersion type electron gun of claim 1, wherein a pair of said permanent magnets are disposed in such a way as to sandwich the ion pump anode and cathode in a direction parallel to the optical axis.

5. The magnetic field immersion type electron gun of claim 1, wherein the yoke gap is formed at a lower end portion of the radially inner circumferential surface of said hollow cylindrical yoke so as to face an electron gun cathode.

6. The magnetic field immersion type electron gun of claim 1, wherein a pair of said permanent magnets are disposed within a vacuum vessel of said coaxial ion pump.

7. The magnetic field immersion type electron gun of claim 1, wherein said permanent magnets are formed of samarium cobalt.

8. A magnetic field immersion type electron gun, comprising:

an electron gun body;

an electric field lens for controlling an electron beam emitted from said electron gun body; and a magnetic field lens formed by ion pump magnets of a coaxial ion pump, for controlling the electron beam emitted by said electron gun body, wherein:

the ion pump magnets include:
a pair of cylindrical permanent magnets disposed coaxially with an optical axis of said electron gun body in such a way as to sandwich a cylindrical ion pump anode of the coaxial ion pump, the two permanent magnets being magnetized in a mutually opposing direction; and
a hollow cylindrical yoke disposed coaxially with the optical axis in such a way as to enclose said two permanent magnets within a hollow portion thereof, said yoke being formed with an annular yoke gap for leaking out a magnetic flux flowing through said yoke toward the optical axis in a radially inner circumferential surface thereof facing the optical axis.

* * * * *